(12) United States Patent
Goyal et al.

(10) Patent No.: US 8,612,905 B1
(45) Date of Patent: Dec. 17, 2013

(54) SYSTEM METHOD AND APPARATUS FOR VACUITY DETECTION

(75) Inventors: Pradeep Goyal, Uttar Pradesh (IN); Alok Jain, Delhi (IN); Manu Chopra, Delhi (IN); Anurag Gupta, Uttar Pradesh (IN); Deepak Yadav, Uttar Pradesh (IN)

(73) Assignee: Cadence Design Systems, Inc., San Jose, CA (US)

( * ) Notice: Subject to any disclaimer, the term of this patent is extended or adjusted under 35 U.S.C. 154(b) by 798 days.

(21) Appl. No.: 11/972,884

(22) Filed: Jan. 11, 2008

(51) Int. Cl.
*G06F 17/50* (2006.01)

(52) U.S. Cl.
USPC .......................................................... 716/106

(58) Field of Classification Search
USPC .................................................... 716/5, 106
See application file for complete search history.

(56) References Cited

U.S. PATENT DOCUMENTS

| | | | |
|---|---|---|---|
| 2005/0192789 A1* | 9/2005 | Yang | 703/22 |
| 2007/0067746 A1* | 3/2007 | Baumgartner et al. | 716/5 |
| 2008/0066033 A1* | 3/2008 | Baumgartner et al. | 716/5 |

OTHER PUBLICATIONS

Gheorghiu et al., "VaqUoT: A Tool for Vacuity Detection", In Proceedings of Tool Track, FM'06, 2005.*
Chechik et al., "Finding Environment Guarantees", Fundamental Approaches to Software Engineering, 10th International Conference, FASE 2007, Held as Part of the Joint European Conferences, on Theory and Practice of Software, ETAPS 2007, Braga, Portugal, Mar. 24-Apr. 1, 2007, pp. 352-367.*
Tzoref et al., "Automatic Refinement and Vacuity Detection for Symbolic Trajectory Evaluation", In Computer Aided Verification (CAV}, 2006, pp. 190-204.*

* cited by examiner

*Primary Examiner* — Jack Chiang
*Assistant Examiner* — Brandon Bowers
(74) *Attorney, Agent, or Firm* — Holland & Knight LLP; Mark H. Whittenberger, Esq.

(57) ABSTRACT

A method and apparatus for producing a vacuity detection report to reduce false positive verification results for digital circuits provided. In an exemplary embodiment, a design description of the digital design is generated. From the design description, a vacuity detection problem is derived by introducing an assertion into the design description. By introducing an assertion into the design description, the vacuity detection problem is solvable by formal assertion based verification engines. A verification engine is then used to solve the vacuity detection problem and produce a vacuity detection report. This Abstract is provided for the sole purpose of complying with the Abstract requirement rules that allow a reader to quickly ascertain the subject matter of the disclosure contained herein. This Abstract is submitted with the explicit understanding that it will not be used to interpret or to limit the scope or the meaning of the claims.

25 Claims, 6 Drawing Sheets

SYSTEM METHOD AND APPARATUS FOR VACUITY DETECTION

FIELD OF THE INVENTION

The present invention generally relates to integrated circuits. More particularly, the invention concerns a system, methods and apparatus for vacuity detection in integrated circuit design.

BACKGROUND OF THE INVENTION

Integrated circuits (ICs) have become the backbone of modern consumer electronics. The increased demand for functionality of consumer electronics has forced the complexity of IC's to skyrocket. In a number of applications, ICs must be highly functional, low cost and have low power consumption. These demands create increased complexity on the design, verification, and manufacture of ICs.

A typical IC design may involve the creation of electronic components, such as transistors and resistors, and the interconnections of these components onto a substrate, such as silicon. The simulation, verification, and sometimes layout of these components usually is accomplished in sub-blocks, or modules. Each block may be simulated and verified individually. Multiple design teams typically work on the individual blocks. During the design process functional verification is critical.

Functional verification involves the verification that the design conforms to the specification. Functional verification may involve the validation that a design meets the desired functionality. Part of the process of verification includes the creation of Register Transfer Level (RTL) digital designs that describe in detail the functionality of the device or block at every cycle of the clock. Creation and verification RTL design may be one of the more difficult portions of the design process. In many instances, this verification is a very difficult and time intensive task. Simulation tools are typically used to assist in verification.

Assertion-Based Verification (ABV) has been recently identified as a powerful verification paradigm that assures improved observability and controllability of the design, improved verification efficiency by detecting more bugs quickly and thereby facilitating enhanced productivity and higher design quality. With ABV, assertions are used to capture the required design behavior in an unambiguous way and constraints are used to define the environment for the assertion verification. Whenever an assertion fails, the tool displays a waveform that shows the sequence of events that has lead to the failure of assertion. On the other hand, when the answer to the correctness query is positive, most model-checking tools provide no additional information. In the last few years there has been growing awareness to the importance of suspecting the specification of environment for verification also in case model checking succeeds. The goal of vacuity check is to detect such incorrect environment specification (or over constraining) by further automatic reasoning even before we start assertion verification. The vacuity check detects if the constraints are in conflict with the design and also detects if the constraints are in conflict themselves. The challenge is to define vacuity check formally, develop algorithms for detecting the vacuous specification and most importantly report back the constraint or a list of constraints which are responsible for the vacuity.

Following approaches have been used in the past to handle such error situations.

Generate automatic trigger checks for the assertions. The trigger checks detect the coverage of a sequence of events associated with the assertion specification.

Perform vacuity checks to see if the constraints are in conflict with the design and also check to see if constraints are in conflict themselves without design specification.

One problem with trigger checks is that they are part of the assertions and they can only check the coverage of trigger checks specific to one assertion. This can result in performance issues. Additionally, these checks do not provide any information up-front about the error in environment specification in an automatic way.

Vacuity checks, on the other hand, work on the constraints to check for valid environment specification. There are existing solutions and implementations to detect vacuity, but these implementations rely on particular model-checking techniques and may not work with different kinds of model checking engines (For example BDD based engines, SAT based engines or ATPG based engines).

Therefore, there exists a need for a system, and methods for detecting vacuity conditions.

SUMMARY OF THE INVENTION

The present invention provides a system, apparatus and methods for overcoming some of the difficulties presented above. In an exemplary embodiment, a method of producing a vacuity report is provided. In this method a digital design description is derived with at least one constraint. From the digital design description a vacuity detection problem is derived by introducing an assertion into the design description to detect an infinite path in the design description. An assertion based verification is then performed on the vacuity detection problem and a vacuity detection report is generated from the results of the assertion based verification. In an exemplary embodiment the vacuity detection report contains no vacuity when the assertion based verification fails and contains a vacuity when the assertion based verification passes. One feature of this embodiment is that it allows for automated vacuity detection of digital designs.

In a another embodiment, a computing apparatus is provided. The computing apparatus includes a processor, a memory, and a storage medium. Contained on the storage medium is a set of computer executable instructions that, when executed by the processor, configure the computing apparatus to generate a vacuity detection report. This configuration is a configuration to generate, or accept, a digital design description that is a representation of a digital design. In this embodiment, the design description includes at least one constraint. The configuration further generates a vacuity detection problem by introducing an assertion into the design description to check for an infinite path in the design description. The configuration further performs an assertion based verification on the vacuity problem and produces a vacuity detection report. In an exemplary embodiment, the vacuity detection report contains no vacuity when the assertion based verification fails and contains a vacuity when the assertion based verification passes. One feature of this embodiment is that it allows for automated vacuity detection of digital designs. Further, since the vacuity detection problem has been derived as an assertion problem, the vacuity detection report can be generated by any assertion based checker.

In a still further embodiment, a computer software product is provided. The computer software product includes a computer readable medium that includes a set of processor executable instructions. These instructions, when executed, by a processor contained within a computing apparatus, configure the computing apparatus to generate a vacuity detection report. This configuration is a configuration to generate, or accept, a digital design description that is a representation of a digital design. In this embodiment, the design description includes at least one constraint. The configuration further generates a vacuity detection problem by introducing an assertion into the design description to check for an infinite path in the design description. The configuration further performs an assertion based verification on the vacuity problem and produces a vacuity detection report. In an exemplary embodiment, the vacuity detection report contains no vacuity when the assertion based verification fails and contains a vacuity when the assertion based verification passes. One feature of this embodiment is that it allows for automated vacuity detection of digital designs. Further, since the vacuity detection problem has been derived as an assertion problem, the vacuity detection report can be generated by any assertion based checker.

BRIEF DESCRIPTION OF THE DRAWINGS

Various embodiments of the present invention taught herein are illustrated by way of example, and not by way of limitation, in the figures of the accompanying drawings, in which.

Figure 1:
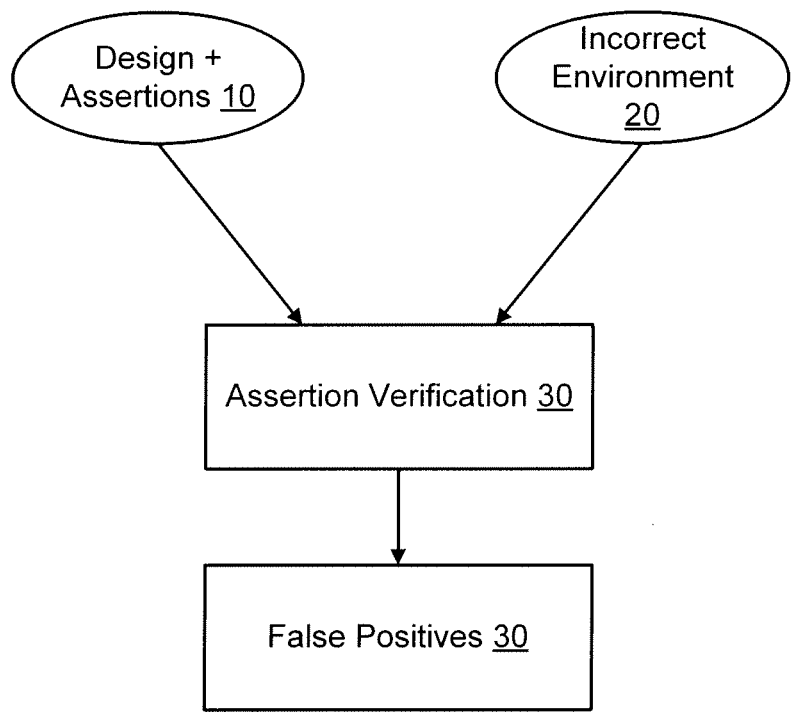
FIG. 1 illustrates an environment leading to false positive results.

It will be recognized that some or all of the Figures are schematic representations for purposes of illustration and do not necessarily depict the actual relative sizes or locations of the elements shown. The Figures are provided for the purpose of illustrating one or more embodiments of the invention with the explicit understanding that they will not be used to limit the scope or the meaning of the claims.

DETAILED DESCRIPTION OF THE INVENTION

In the following paragraphs, the present invention will be described in detail by way of example with reference to the attached drawings. While this invention is capable of embodiment in many different forms, there is shown in the drawings and will herein be described in detail specific embodiments, with the understanding that the present disclosure is to be considered as an example of the principles of the invention and not intended to limit the invention to the specific embodiments shown and described. That is, throughout this description, the embodiments and examples shown should be considered as exemplars, rather than as limitations on the present invention. Descriptions of well known components, methods and/or processing techniques are omitted so as to not unnecessarily obscure the invention. As used herein, the "present invention" refers to any one of the embodiments of the invention described herein, and any equivalents. Furthermore, reference to various feature(s) of the "present invention" throughout this document does not mean that all claimed embodiments or methods must include the referenced feature(s).

Verification is the process of validating whether a circuit design conforms to the specification it was designed to meet. In smaller designs, the task of verification may be trivial, but as digital design complexity increases, verification becomes significantly difficult. In most digital designs suited for commercial applications, there may be no possibility of exercising all logic. In the process of verification a design description is checked against an environment specification. Since exercising the entire description may lead to a problem too large to solve, many approaches to verification introduce a set of assertions that work with the description to verify portions of a design. A significant problem arises, illustrated in FIG. 1, when a design description 10 is verified against an incorrect environment specification 20. The assertion verification 30 of a design description 10 in this situation may lead to false positive results 40 indicating accuracy of the design, when in fact there are errors.

Figure 2:
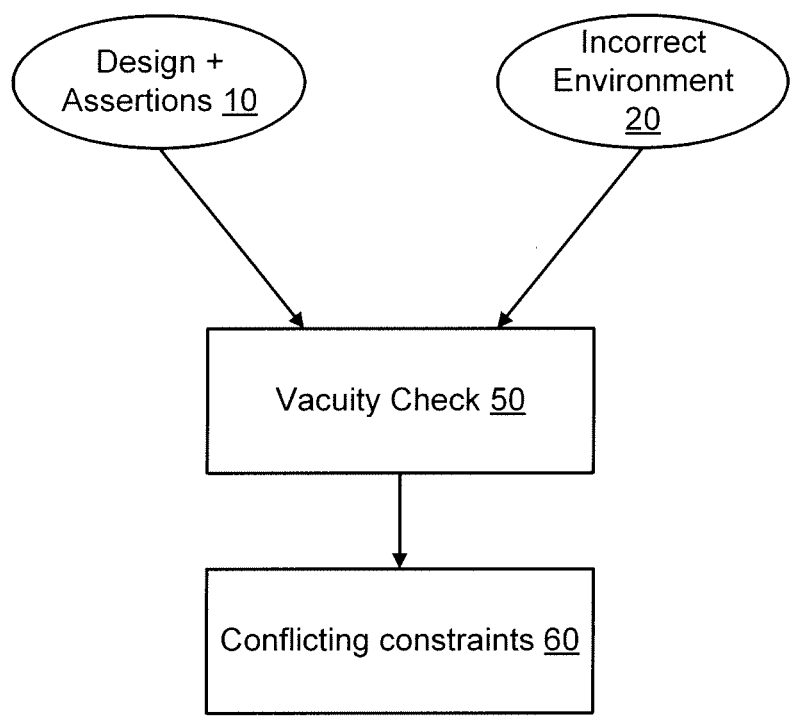
FIG. 2 illustrates an incorrect environment leading to a vacuity report.

One feature of the present invention is illustrated in FIG. 2. In this illustration a design description 10 is to be verified against an incorrect environment specification 20. Prior to the verification, a vacuity check 50 is performed that reports conflicting constraints 60. One advantage illustrated is that an incorrect environment 20 may be detected prior to running full verification 30 on design description 10. By introducing vacuity check 50 into the process false positives 40 can be dramatically reduced. By employing various embodiments of the present invention, a designer of digital circuits can be reassured that the design properly meets a correct environment, thereby reducing costs associated with fabricating a circuit which would later fail post silicon validation.

In order to detect vacuity condition, the existence of a reachable infinite path in the system needs to be checked. Various provided embodiments exploit the fact that formal verification engines perform exhaustive search in order to find a failure for the specified assertion. Employing a check that no infinite paths in the system, the formal verification tools will search for all the possibilities in order to find an infinite path. We create a simple Linear Temporal Logic check such as F(false).

This means that for all paths in the system eventually "FALSE" will occur. Note that "FALSE" is something that does not hold on any of the state in the system. So, a simple counter-example for the failure of this assertion is any reachable cycle. The only way this assertion can pass is when there is no reachable cycle in the system. The finite automata model of the system on which formal verification is performed has all infinite paths. The paths are cut only because of constraints specified by the user which are to be honored while performing assertion verification. The result of a failure in verification of F(false) implies that there is at least one infinite path in the entire system. If the verification succeeds there is no infinite path in the system and that would in turn mean that there is a vacuity.

In one embodiment, this check is created automatically in order to detect vacuity condition. Since most model-checking engines perform constraint analysis in order to reduce the complexity of the problem, a cone of influence is done on the net(s) in the support set of the assertion being proven. In this embodiment, the support set is empty and, hence, the model checking engines will drop all the constraints from the assertion verification. This will lead to assertion failure but in the absence of constraints. In order to overcome this problem, the model checking engines have to be enhanced to verify this particular assertion in the presence of all the constraints, i.e., without dropping any constraint.

In one embodiment, the generation of a vacuity detection problem involves introducing an assertion check into the design description and environment. Since the problem is now reduced into an assertion verification problem, standard model checking software engines which support unbounded model checking can be used.

Figure 3:
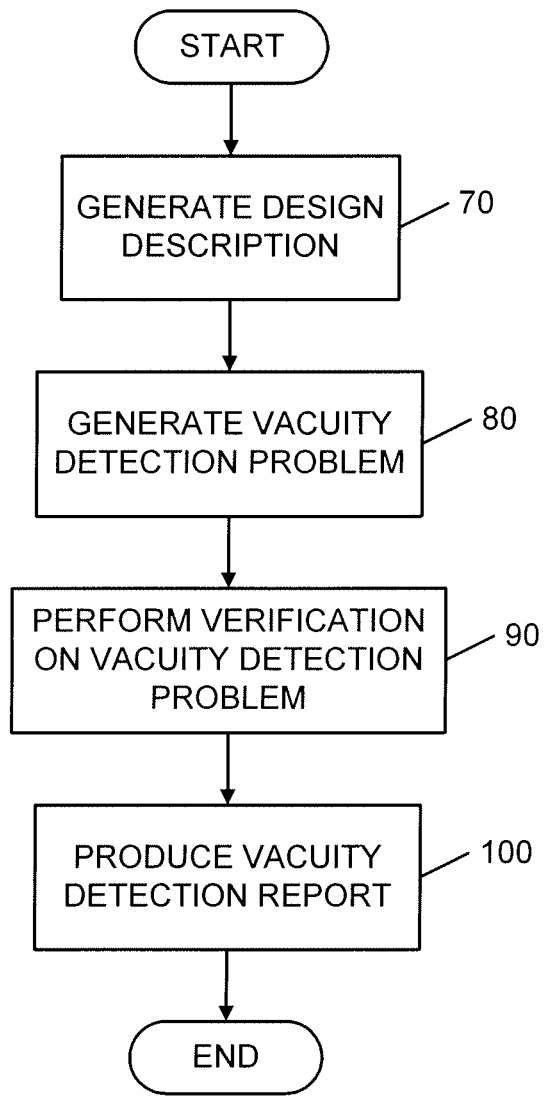
FIG. 3 illustrates a method of producing a vacuity report consistent with provided embodiments.

An exemplary embodiment of a provided method is illustrated in FIG. 3. In this embodiment, flow begins in block 70 where a digital design description is generated from a design. Flow continues to block 80 where a vacuity detection problem is generated from the design description and the environment specification. In block 90, an assertion based verification is performed on the vacuity detection problem. Flow continues to block 100 where a vacuity detection report is generated from the results of the verification.

Figure 4:
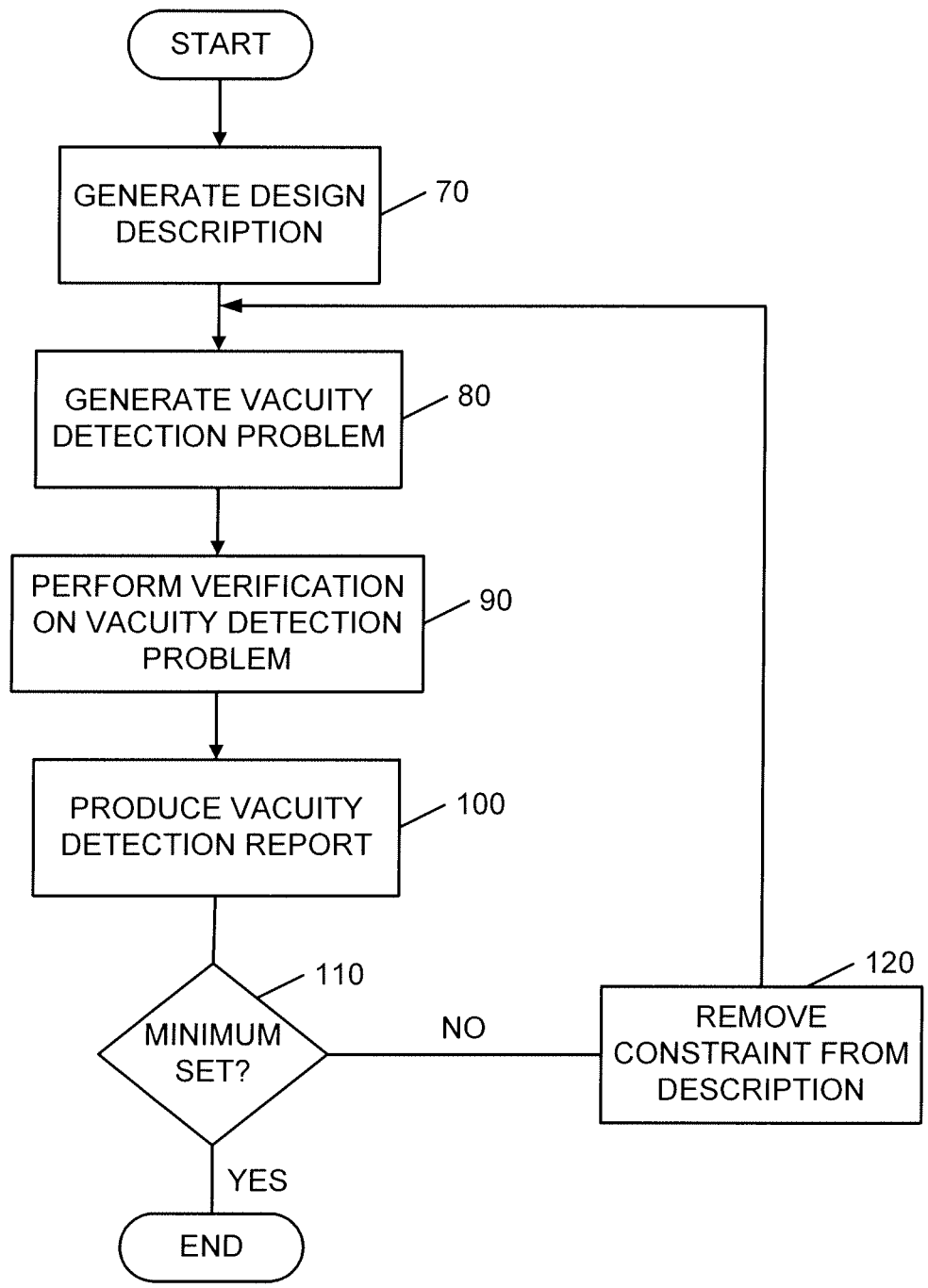
FIG. 4 illustrates a method of producing a vacuity report consistent with provided embodiments.

An alternate embodiment of a method is illustrated in FIG. 4. In this embodiment, similar to the embodiment illustrated in FIG. 3, flow begins in block 70 where a digital design description is generated from a design. Flow continues to block 80 where a vacuity detection problem is generated from the design description and the environment specification. In block 90, an assertion based verification is performed on the vacuity detection problem. Flow continues to block 100 where a vacuity detection report is generated from the results of the verification. Flow then continues to conditional block 110 where the vacuity detection report is examined to determine if it contains a minimum set of constraints causing the vacuity. If the set is a minimum set, the method ends. In the alternative, if the set is not a minimum set, flow continues to block 120 where at least one constraint is removed from the description and the flow repeats blocks 80 through 100 until conditional block 110 evaluates positive the report contains a minimum set of constraints.

Figure 5:
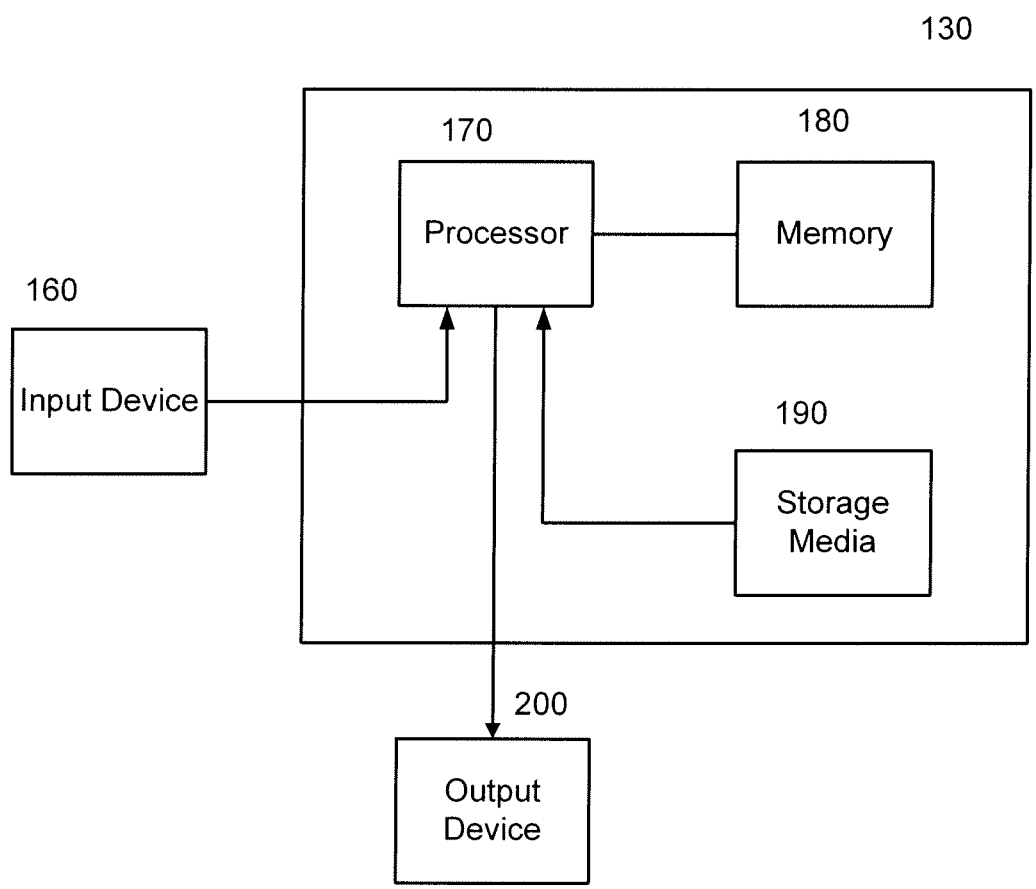
FIG. 5 illustrates a computing apparatus consistent with provided embodiments.

FIG. 5 illustrates an exemplary embodiment of a computing device consistent with various provided embodiments. Computing device 130 contains a processor 170, memory 180, and storage media 190. As illustrated in FIG. 5, computing device 130 may additionally be connected to input device 160 and output device 200. In one embodiment, storage media 190 contains a set of processor executable instructions that, when executed by processor 170, configure computing device 130 to produce a vacuity detection report for a digital design. An exemplary configuration for the production of a vacuity detection report includes a configuration to generate a design description for the design. This configuration then generates a vacuity detection problem by introducing an assertion into the design description. The assertion being designed to check for the existence of an infinite path in the design description. The configuration further includes a configuration to perform an assertion based verification on the vacuity detection problem and produce a vacuity detection report based on the verification.

In one embodiment, the vacuity detection report contains no vacuity when the assertion based verification fails. In another embodiment, the vacuity detection report contains the existence of a vacuity when the assertion based verification passes. As is known in the art, the assertion based verification may accomplish verification by using an exhaustive search. In this embodiment, the vacuity detection report will contain at least one constraint causing the vacuity when the assertion passes. A further embodiment of a computing apparatus includes a configuration to remove at least one constraint from the vacuity detection report and repeat the process until the minimum set of constraints causing vacuity is derived.

An important feature of various provided embodiments is that they allow for an automation of vacuity detection prior to formal verification of the digital design. This allows for inaccurate design environments to be detected and false positive results to be reduced in the verification process. Further, since verification is a step accomplished prior to fabrication errors may be detected early which can save significant time and costs in fabrication of designs that may not work as intended.

Figure 6:
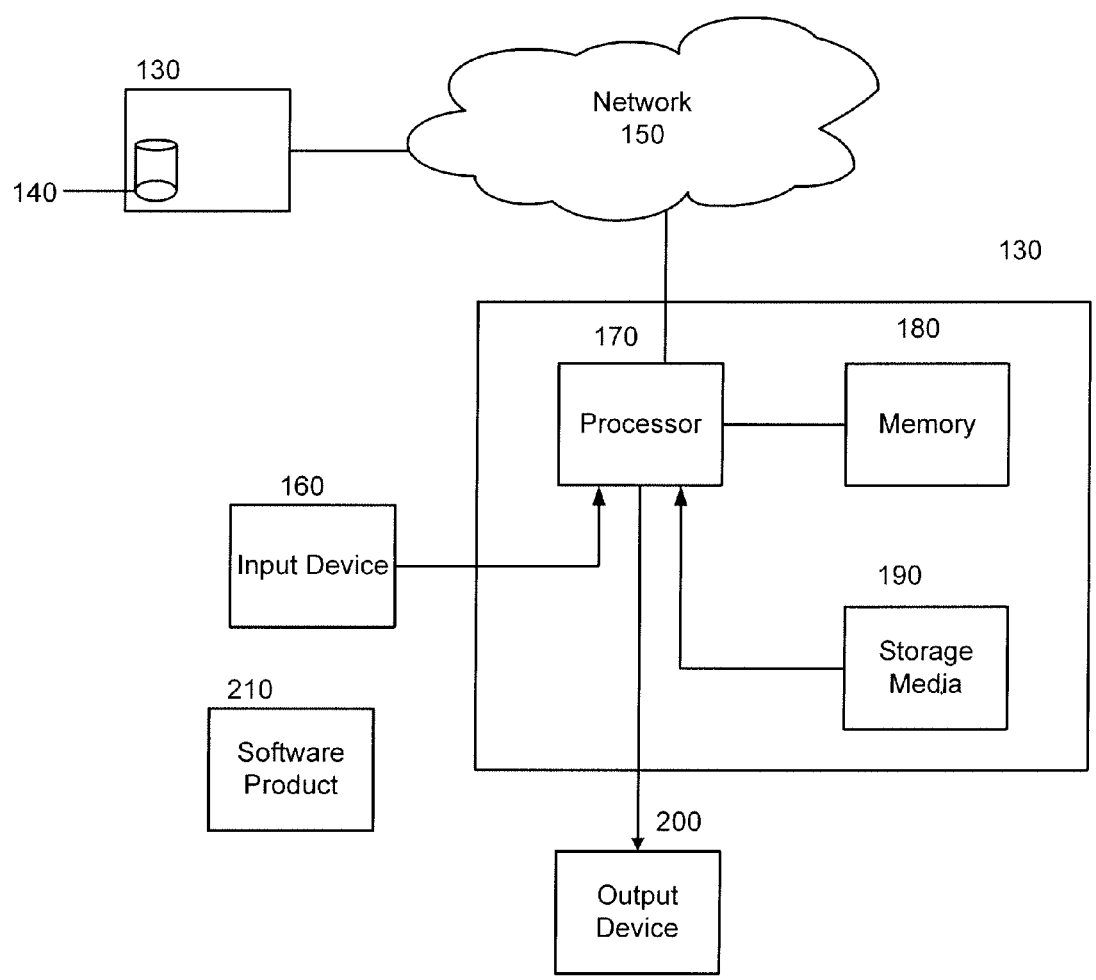
FIG. 6 illustrates a computer software product consistent with provided embodiments.

An embodiment of a provided computer software product is illustrated in FIG. 6. In this embodiment, computing apparatus 130 is again illustrated with processor 170, storage media 190 and memory 180. It is further illustrated with optional input device 160 and output device 200 connected to computing apparatus 130. In various embodiments, software product 210 may be any machine readable media (such as CD-ROM, DVD and the like). Contained on the media is a set of processor executable instructions that when executed by processor 170 configure computing apparatus 130 to produce a vacuity detection report as described above. In an exemplary embodiment, computing device 130 is connected to a network 150 and the processor executable instructions are located on database 140 on a media within another computing device 130.

Thus, it is seen that a system, method and apparatus for vacuity report generation are provided. One skilled in the art will appreciate that the present invention can be practiced by other than the above-described embodiments, which are presented in this description for purposes of illustration and not of limitation. The specification and drawings are not intended to limit the exclusionary scope of this patent document. It is noted that various equivalents for the particular embodiments discussed in this description may practice the invention as well. That is, while the present invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims. The fact that a product, process or method exhibits differences from one or more of the above-described exemplary embodiments does not mean that the product or process is outside the scope (literal scope and/or other legally-recognized scope) of the following claims.

What is claimed is:

1. A computer-implemented method for the design of integrated circuits, comprising:
   (a) generating a digital design description, the digital design description comprising a representation of the digital design and at least one constraint;
   (b) generating a vacuity detection problem, in which vacuity of false positive design verification is associated with incorrect environment specification, by introducing an assertion into the design description, the assertion configured to check for the existence of an infinite path in the design description;
   (c) performing assertion based verification, by using a computer, on the vacuity detection problem; and
   (d) producing the vacuity detection report, by using a computer, that indicates whether a vacuity of design verification exists, which can be used to reduce false positive verification results.

2. The method of claim 1, wherein the vacuity detection report contains no vacuity when the assertion based verification fails.

3. The method of claim 1, wherein the vacuity detection report contains the existence of a vacuity when the assertion based verification passes.

4. The method of claim 3, wherein the vacuity report further contains at least on constraint.

5. The method of claim 4, wherein the vacuity report indicates, in some cases, that the at least one constraint causes the vacuity.

6. The method of claim 5, further comprising removing one of the at least one constraints from the digital design description and repeating (b) and (c).

7. The method of claim 6, wherein the removing and repeating are done until a minimum set of constraints causing the vacuity is derived.

8. The method of claim 1, wherein performing the assertion based verification comprises performing an exhaustive search for the assertion.

9. A computing apparatus comprising:
    a processor;
    a storage medium, the storage medium comprising a set of processor executable instructions that, when executed by the processor configure the computing apparatus to:
      (a) generate a digital design description, the digital design description comprising a representation of the digital design and at least one constraint;
      (b) generate a vacuity detection problem, in which a vacuity is associated with a false positive design verification, by introducing an assertion into the design description, the assertion configured to check for the existence of an infinite path in the design description;
      (c) perform assertion based verification on the vacuity detection problem; and
      (d) produce the vacuity detection report that indicates whether conflicting constraints exist in the environment specification, which can be used to reduce false positive verification results.

10. The computing apparatus of claim 9, wherein the vacuity detection report contains no vacuity when the assertion based verification fails.

11. The computing apparatus of claim 10, wherein the configuration further comprises a configuration to produce an assertion based verification report form the digital design description.

12. The computing apparatus of claim 9, wherein the vacuity detection report contains the existence of a vacuity when the assertion based verification passes.

13. The computing apparatus of claim 12, wherein the vacuity report further contains at least one constraint.

14. The computing apparatus of claim 13, wherein the vacuity report indicates, in some cases, that the at least one constraint causes the vacuity.

15. The computing apparatus of claim 14, wherein the configuration further comprises a configuration to remove one of the at least one constraints from the digital design description and repeat (b) and (c).

16. The computing apparatus of claim 14, wherein the configuration further comprises a configuration to remove one of the constraints and repeat (b) and (c) until a minimum set of constraints causing the vacuity is derived.

17. The computing apparatus of claim 9, wherein performing the assertion based verification comprises performing an exhaustive search for the assertion.

18. A computer software product comprising:
    a non-transitory computer readable storage medium, wherein the non-transitory computer readable storage medium comprises a set of processor executable instructions, that when executed by a processor configure a computer to:
      (a) generate a digital design description, the digital design description comprising a representation of the digital design and at least one constraint;
      (b) generate a vacuity detection problem, in which a vacuity is associated with false positive design verification caused by incorrect environment specification, by introducing an assertion into the design description, the assertion configured to check for the existence of an infinite path in the design description;
      (c) perform assertion based verification, by using a computer, on the vacuity detection problem; and
      (d) produce the vacuity detection report, by using a computer, that indicates whether a vacuity of design verification exists, which can be used to reduce false positive verification results.

19. The computer software product of claim 18, wherein the vacuity detection report contains no vacuity when the assertion based verification fails.

20. The computer software product of claim 19, wherein the configuration further comprises a configuration to produce an assertion based verification report from the digital design description.

21. The computer software product of claim 18, wherein the vacuity detection report contains the existence of a vacuity when the assertion based verification passes.

22. The computer software product of claim 21, wherein the vacuity report further contains at least one constraint.

23. The computer software product of claim 22, wherein the vacuity report indicates, in some cases, that the at least one constraint causes the vacuity.

24. The computer software product of claim 23, wherein the configuration further comprises a configuration to remove one of the at least one constraints from the digital design description and repeat (b) and (c).

25. The computer software product of claim 23, wherein the configuration further comprises a configuration to remove one of the constraints and repeat (b) and (c) until a minimum set of constraints causing the vacuity is derived.

\* \* \* \* \*